United States Patent [19]

Marple et al.

[11] Patent Number: 4,698,528
[45] Date of Patent: Oct. 6, 1987

[54] EDGE DETECTION USING DUAL TRANS-IMPEDANCE AMPLIFIER

[75] Inventors: Wendell P. Marple; Hubert A. Miller, both of Manassas, Va.

[73] Assignee: International Business Machines Corporation, Armonk, N.Y.

[21] Appl. No.: 768,289

[22] Filed: Aug. 22, 1985

[51] Int. Cl.$^4$ .................. G01R 19/12; G01R 29/02
[52] U.S. Cl. .................................... 307/517; 307/520
[58] Field of Search ............... 307/517, 510, 234, 513, 307/516, 520, 236, 350; 328/109, 114, 115, 118, 150; 235/455; 330/293

[56] References Cited

U.S. PATENT DOCUMENTS

| | | | |
|---|---|---|---|
| 3,678,295 | 7/1972 | Heneghan | 307/350 |
| 3,993,894 | 11/1976 | Walker | 235/455 |
| 4,146,846 | 3/1979 | Thomas et al. | 330/293 |
| 4,241,309 | 12/1980 | Elder | 328/115 |

Primary Examiner—Thomas H. Tarcza
Assistant Examiner—John B. Sotomayor
Attorney, Agent, or Firm—H. St. Julian; John E. Hoel

[57] ABSTRACT

A current pulse signal, which is generated by an optical detector, is fed to an input of an edge detector circuit. The current pulse signal is converted into a differentiated voltage pulse signal having a negative going pulse corresponding to a positive going slope of the input signal and a positive going pulse corresponding to the negative going slope of the input waveform. The positive differentiated pulse has a rise amplitude which is larger than its fall amplitude so that its most positive down level has a relatively positive absolute voltage value. Correspondingly, the negative differentiated pulse has a fall amplitude which is greater than its rising amplitude so that its most negative up level is more negative in absolute value than a nominal median zero voltage reference level. The output of the edge detection circuit is connected to a dual threshold comparator having a positive threshold for detecting valid positive differentiated pulses and a negative threshold for detecting valid negative differentiated pulses. Noise components on them most positive down level of the positive differentiated pulse and the most negative up level of the negative differentiated pulse are less likely to exceed the positive and the negative threshold values, respectively, of the comparator. Therefore, the likelihood that a reliable detection of valid positive and negative pulses is enhanced as well as enhancing the noise immunity for background noise in high speed, small amplitude current pulse applications.

5 Claims, 2 Drawing Figures

EDGE DETECTION USING DUAL TRANS-IMPEDANCE AMPLIFIER

BACKGROUND OF THE INVENTION

1. Technical Field

The invention disclosed broadly relates to transistor circuits and more particularly relates to an improved edge detection circuit.

2. Background Art

In fiber-optic communications systems, a light pulse transmitted from an information source is conducted along the optical fiber and is received by an optical detector such as a photo diode. Typically, the photo diode will generate a current pulse which then must be reliably detected in a noisy background. The current pulse generated by the optical detector is quite small, typically on the order of nanoamperes and having a duration of approximately 25 nanoseconds for typical high bandwidth communications applications. Noise sources include a dark current which arises from the reverse bias leakage current in conventional PIN diode structures. In addition, statistically occurring shot noise and thermally generated noise will also be introduced into the current waveform generated by the photo diode.

Typically, in order to reliably detect current pulses, edge detection techniques are employed wherein the current pulse is converted to a voltage pulse and is differentiated so that the positive going slope of the pulse is converted into a positive going signal and the negative going slope of the pulse is converted into a negative going signal which is output from a differentiator. The more precise occurrence of the differentiated positive going and negative going pulses allow for more precise detection of the time of occurrence of current pulse signals. The problem in the prior art has been detecting the differentiated waveform in a noisy background environment. Frequently, the amplitude of the noise pulses are almost as large as the amplitude of the differentiated positive going and negative going waveform and therefore the reliable detection of the information waveform is diminished.

OBJECTS OF THE INVENTION

It is therefore an object of the invention to more reliably detect differentiated waveforms of current pulse signals.

It is a further object of the invention to improve the detection of waveforms in a high noise background environment.

It is still a further object of the invention to provide an improved optical detection circuit capable of operating in a high noise environment.

SUMMARY OF THE INVENTION

These and other objects, features and advantages of the invention are accomplished by an edge detection circuit using a dual trans-impedance amplifier, disclosed herein. The disclosed circuit will accept at its input a current pulse signal generated by an optical detector such as a photo diode detector. The current pulse signal is converted into a differentiated voltage pulse signal. The differentiated signal has a negative going component corresponding to the positive going slope of the input waveform and a positive going component corresponding to the negative going input waveform. The positive differentiated pulse has a rise amplitude which is larger than its fall amplitude so that its most positive down level has a relatively positive absolute voltage value. Correspondingly, the negative differentiated pulse has a fall amplitude which is greater than its rising amplitude with a resulting most negative up level zero reference potential which is more negative in absolute value than a nominal median zero voltage reference level. The output of the edge detection circuit is connected to a dual threshold comparator having a positive threshold for detecting valid positive going differentiated pulses and a negative threshold for detecting valid negative going differentiated pulses. Assuming a hypothetical median reference voltage halfway between the positive threshold and the negative threshold of the comparator connected to the output of the edge detection circuit, one can better understand the advantages of the invention. As was described above, the most positive down level reference potential following the negative going differentiated pulse has an absolute magnitude which is slightly more positive than the negative threshold of the comparator and substantially more negative than the positive threshold of the comparator. Therefore, in accordance with the invention, noise components on the most positive down level reference waveform will not be as likely to have positive going excursions which exceed the positive threshold value of the comparator. Therefore, it is more likely that a reliable detection of the positive pulse for the differentiated waveform can be detected. Correspondingly, the most negative up level pedestal following the positive differentiated pulse is slightly more negative than the positive threshold for the comparator and substantially more positive than the negative threshold for the comparator. Therefore, in accordance with the invention, noise on the pedestal portion following the positive going differentiated waveform will be less likely to have a negative going excursion which will exceed the negative threshold for the comparator. This will increase the reliability for the detection of valid negative going differentiated pulses out of the edge detection circuit.

The resultant edge detection circuit has an enhanced noise immunity for background noise in high speed, small amplitude current pulse applications such as in optical pulse detection.

BRIEF DESCRIPTION OF THE DRAWINGS

The foregoing and other advantages of the invention will be more fully understood with reference to the description of the best mode and the drawing wherein.

DESCRIPTION OF THE BEST MODE FOR CARRYING OUT THE INVENTION

Figure 1:
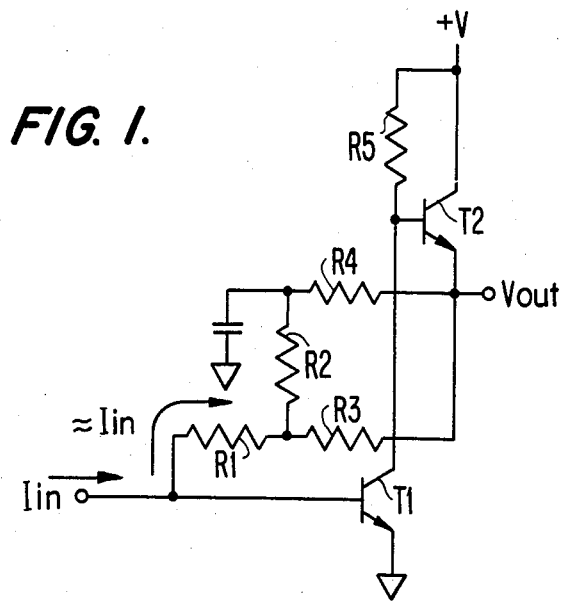
FIG. 1 is a circuit schematic diagram of the invention.
Figure 2A:
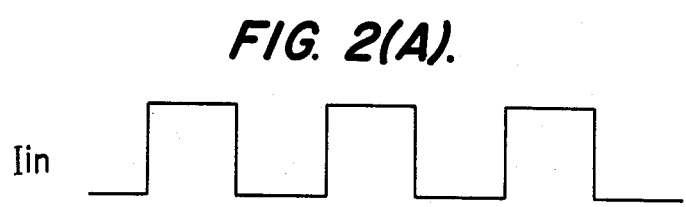
FIG. 2 is a waveform diagram illustrating the operation of the invention, with part A illustrating the input waveform for the current pulse and part B illustrating the output waveform for the edge detection circuit invention.
Figure 2B:
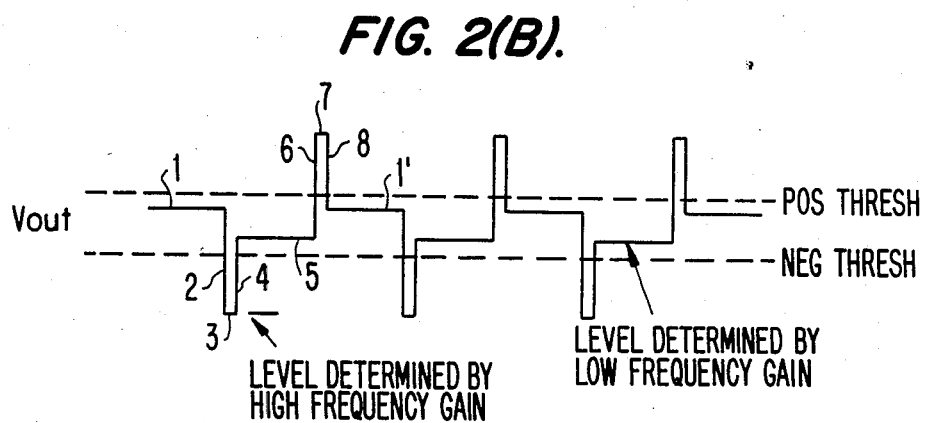

Referring to FIG. 1, a circuit schematic diagram for an edge detection circuit is illustrated therein. An input waveform, as is shown in waveform A of FIG. 2, is input as a current waveform $I_{in}$ to the base terminal of an NPN transistor T1. A resistor R1 is connected to the base terminal of transistor T1 and is connected through a resistor R3 to the emitter of an NPN transistor T2, which also serves as the output node $V_{out}$ of the edge detection circuit. A common node between resistors R1 and R3 is connected through a resistor R2 to a capacitor C whose opposite plate is connected to ground potential. A common node between the resistor R2 and the capacitor C is connected to resistor R4 which in turn is connected to the output node $V_{out}$. The collector of the transistor T1 is connected to the base of the transistor T2 and, through a resistor R5 to positive potential $+V$. The potential $+V$ is also connected to the collector of the transistor T2.

In operation, the input waveform shown as waveform A of FIG. 2, is applied to an input terminal of the edge detection circuit. On a positive going edge of the input waveform, the edge has high frequency components which serve to reduce the effective impedance of the capacitor C, thereby making it appear to be a short between the common node of resistors R2 and R4 and ground potential. This increases the effective gain of the edge detection circuit, thereby enabling the edge of the input waveform to produce a negative excursion 2 of the detected edge waveform B as shown in FIG. 2. The detected edge waveform B makes an excursion to a negative amplitude at 3 and stays at that amplitude for a characteristic duration determined by the frequency response of the circuit components resistors R2, R4 and other elements in the circuit. After the characteristic duration, the detected edge waveform B makes a positive excursion 4. The amplitude of that positive excursion 4 is a function of the overall gain of the edge detection circuit. The frequency components of the waveform B are lower at 3 than were the frequency components when the negative excursion 2 of the waveform was generated because of the finite duration at 3 of the edge detected waveform B. Since the frequency components of the waveform at 3 are lower, the effective impedance of the capacitor C is increased, thereby reducing the effective overall gain of the edge detection circuit. In this manner, the amplitude swing at 4 of the detected edge signal is less than the amplitude swing of the waveform at 2. This is a desired feature of the waveform, since the potential of the detected edge waveform B at 5 is more negative than the positive threshold of a pulse detector connected to the output of the edge detection circuit, thereby enhancing the noise immunity of the edge detection circuit so that the next true positive going edge detected signal at 6 in waveform B, can be more readily distinguished from noise which may also be present.

The resultant edge detection circuit has a higher noise immunity characteristic than has been available in the prior art. It has particularly advantageous application to optical receivers in fiber-optic communications.

Although a specific embodiment of the invention has been disclosed, it will be understood by those of skill in the art that the foregoing and other changes in form and details may be made therein without departing from the spirit and the scope of the invention.

What is claimed is:

1. An edge detection circuit comprising:
   a first switching means having a control input connected to an input signal source, with its principal current conducting path connected between a first reference potential and a first node;
   a second switching means having its control input connected to said first node and its principal current conducting path connected between a second reference potential and an output node;
   a feedback filter means having a first terminal connected to said output node and a second terminal connected to an input node;
   said feedback filter means operating on positive going pulse signals input to said input node to differentiate said input signals into a negative differentiated pulse and a positive differentiated pulse forming a differentiated signal;
   said feedback filter means acting on said negative differentiated pulse so that its downward excursion has a greater amplitude than its following upward excursion and on said positive differentiated pulse so that its upward excursion has a greater amplitude than its following downward excursion;
   whereby noise signals superimposed upon said differentiated signal waveform will be of lesser amplitude than a positive going differentiated pulse following said negative going differentiated pulse.

2. The circuit as recited in claim 1 wherein the first switching means comprises a first NPN transistor having its emitter connected to the first reference potential, its base connected to said input node and its collector connected to said first node.

3. The circuit as recited in claim 2 wherein the second switching means comprises a second NPN transistor having its emitter connected to the output node, its base connected to said first node and its collector connected to said second reference potential.

4. The circuit as recited in claim 3 wherein the filter means comprises:
   a first resistor connected between said input node and a second node;
   a second resistor connected between said second node and a third node;
   a third resistor connected between said second node and said output node;
   a fourth resistor connected between said third node and said output node; and
   a capacitor connected between said third node and said second reference potential.

5. An edge detection circuit comprising:
   a first NPN transistor having its emitter connected to ground potential, its base connected to an input node and its collector connected to a first node;
   a second NPN transistor having its emitter connected to an output node, its base connected to said first node, and its collector connected to a positive reference potential;
   a first resistor connected between said input node and a second node;
   a second resistor connected between said second node and a third node;
   a third resistor connected between said third node and said output node;
   a fourth resistor connected between said third node and said output node;
   a capacitor connected between said third node and said positive reference potential;
   said input node having positive going current pulses applied thereto having both high frequency components and low frequency components therein;
   said first resistor, said second resistor, and said third resistor, and said capacitor providing a low gain characteristic for said high frequency components of said input signals to provide a first amplitude output for the differential of said input waveform;
   whereby the most positive up level for the output waveform from said circuit following a negative excursion thereof is more negative than the most positive down level of said output waveform following a positive excursion thereof, thereby enhancing the noise immunity of the output signal.

* * * * *